United States Patent
Lee et al.

(10) Patent No.: US 7,759,756 B2
(45) Date of Patent: Jul. 20, 2010

(54) DUAL-PIXEL FULL COLOR CMOS IMAGER

(75) Inventors: Jong-Jan Lee, Camas, WA (US); Sakae Wada, Nara (JP); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 174 days.

(21) Appl. No.: 12/025,618

(22) Filed: Feb. 4, 2008

(65) Prior Publication Data

US 2009/0194799 A1 Aug. 6, 2009

(51) Int. Cl.
H01L 31/00 (2006.01)
H01L 31/062 (2006.01)
H01L 31/113 (2006.01)

(52) U.S. Cl. .......... 257/440; 257/53; 257/293; 257/438; 257/443; 257/292; 257/225; 257/233; 257/431; 257/288

(58) Field of Classification Search .......... 257/53, 257/225, 233, 288, 291–293, 431, 443, 461, 257/E31.058, E31.063, E31.121, E27.133, 257/E27.134, E25.002, E25.004, E25.009, 257/440

See application file for complete search history.

(56) References Cited

U.S. PATENT DOCUMENTS

| | | | |
|---|---|---|---|
| 5,625,210 A | 4/1997 | Lee et al. | 257/292 |
| 6,727,521 B2 | 4/2004 | Merrill | 275/98 |
| 6,946,715 B2 | 9/2005 | Hong | |
| 6,960,757 B2 | 11/2005 | Merrill et al. | 250/226 |
| 7,132,724 B1 | 11/2006 | Merrill | 257/440 |
| 2004/0178478 A1* | 9/2004 | Shizukuishi | 257/620 |
| 2005/0087829 A1* | 4/2005 | Merrill et al. | 257/440 |
| 2007/0045682 A1* | 3/2007 | Hong et al. | 257/292 |
| 2008/0185619 A1* | 8/2008 | Merrill | 257/292 |

OTHER PUBLICATIONS

S.M. Sze "Semiconductor Devices. Physics and Technology. 2nd Edition", (C) 2002 by John Wiley and Sons, pp. 313-314.*
S.M. Sze "Semiconductor Devices. Physics and Technology. 2nd Edition", (C) 2002 by John Wiley and Sons, p. 37.*
Sze "Semiconductor Devices. Physics and Technology. 2nd Edition", (C) 2002 by John Wiley and Sons.*
Mabuchi et al., "CMOS Image Sensors Comprised of Floating Diffusion Driving Pixels with Buried Photodiode", IEEE Journal of Solid-State Circuits, vol. 39, No. 12, Dec. 2004, pp. 2408-2416.

* cited by examiner

Primary Examiner—N Drew Richards
Assistant Examiner—Sergey Alekseyev
(74) Attorney, Agent, or Firm—Law Office of Gerald Maliszewski; Gerald Maliszewski

(57) ABSTRACT

A dual-pixel full color complementary metal oxide semiconductor (CMOS) imager is provided, along with an associated fabrication process. Two stand-alone pixels are used for three-color detection. The first pixel is a single photodiode, and the second pixel has two photodiodes built in a stacked structure. The two photodiode stack includes an n doped substrate, a bottom photodiode, and a top photodiode. The bottom photodiode has a bottom p doped layer overlying the substrate and a bottom n doped layer cathode overlying the bottom p doped layer. The top photodiode has a top p doped layer overlying the bottom n doped layer and a top n doped layer cathode overlying the top p doped layer. The single photodiode includes the n doped substrate, a p doped layer overlying the substrate, and an n doped layer cathode overlying the p doped layer.

19 Claims, 8 Drawing Sheets

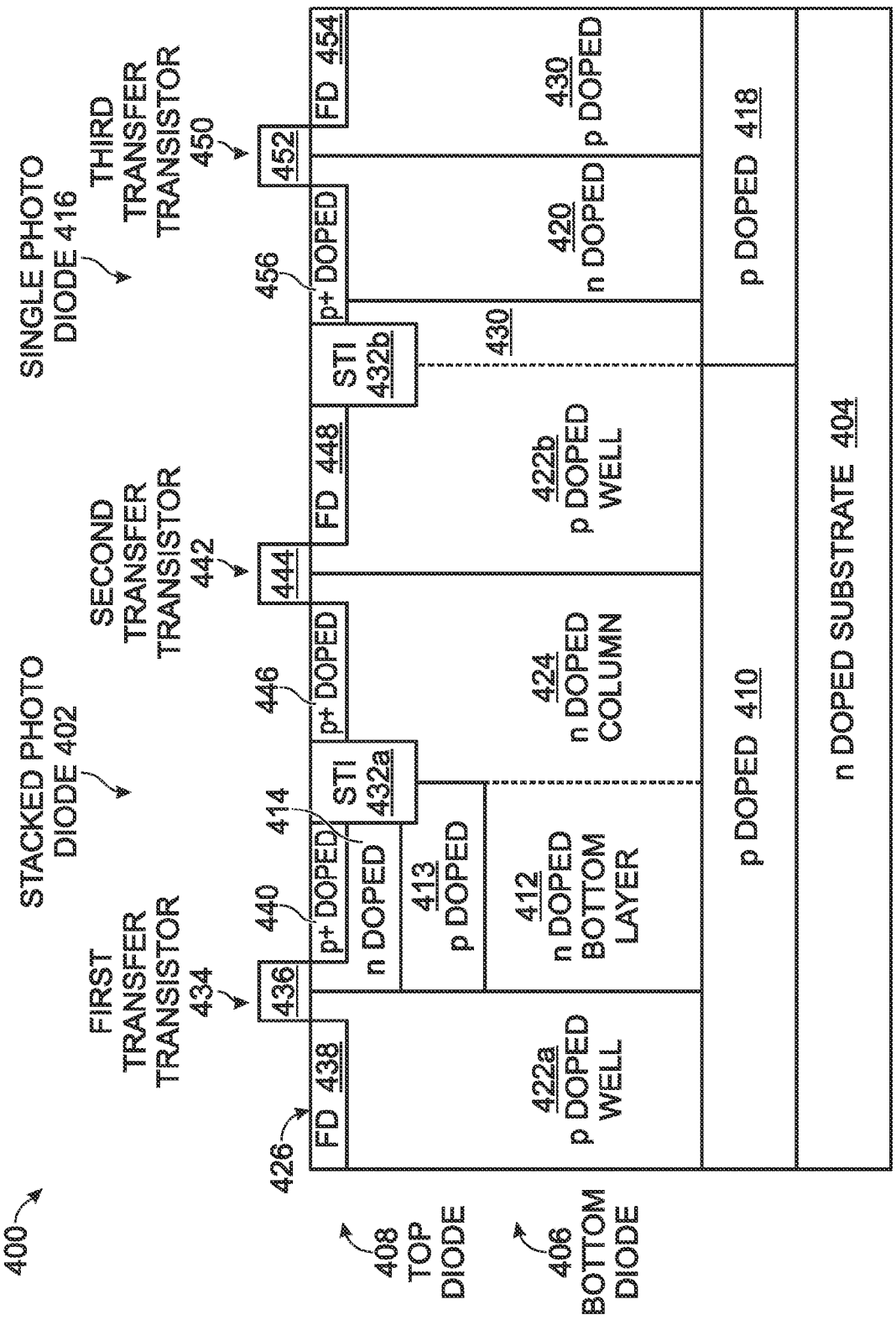

DUAL-PIXEL FULL COLOR CMOS IMAGER

BACKGROUND OF THE INVENTION

1. Field of the Invention

This invention generally relates to integrated circuit (IC) fabrication and, more particularly, a dual-pixel full color imager and associated fabrication process.

2. Description of the Related Art

FIG. 1 depicts a complementary metal oxide semiconductor (CMOS) imager with a "buried" or "pinned" photodiode (prior art). Conventionally, the image cell circuit includes four transistors and one photodiode. The pixel operation is divided into three main stages: reset, exposure, and reading.

(1) The reset stage: by turning on the reset and transfer (Tx) transistors, the photodiode capacitance is charged to a reset voltage. As for the case of the p+np buried photodiode shown in FIG. 1, the buried cathode (n) is totally depleted and set to the pinned voltage ($V_{pin}$).

(2) The exposure stage: with the absorption of light by the photodiode, electron and hole pairs are generated. The holes fill the depleted acceptor sites in the p-region, and the electrons fill the depleted donor sites in the n-region. The potential of the photodiode cathode decreases as the photoelectrons fills up at the donor sites.

(3) The reading stage: the pixel value is read out by a correlated double sampling (CDS) circuit. First, the select transistor and the reset transistor are turned on, the floating diffusion (FD) is set to high, and the output is set to the reference level. Then, the transfer transistor (Tx) is turned on, the accumulated photo-electrons in the photodiode are transferred to the FD. Photo-charges in FD are converted to the signal voltage by a source follower (SF) and read out as signal voltage level. The signal is constructed by subtracting the reference voltage level from the signal voltage level (see FIG. 2).

FIG. 2 is a timing diagram associated with of the pixel circuit of FIG. 1 (prior art). The advantage of using a buried photodiode in a CMOS imager sensor is that low dark currents may be obtained. If the charge in the buried n-cathode can be completely depleted during the reset, and the signal electrons in the buried n-cathode can be completely transferred, then zero lag and zero reset noise can be achieved. Several device design parameters optimization such as: low voltage depleted diode, wide transfer transistor, low threshold voltage, and high gate voltage on transfer transistor must be considered to achieve the complete transfer of the signal electrons in the buried n-cathode.

FIG. 3 is a Bayer color filter pattern (prior art). Conventional CMOS and charge-coupled device (CCD) digital image sensors use a standard photodiode or photogate as the photosensing element. In their native state, the photosensing element captures the light signal as black-and-white. In order to perform color imaging, small color filters are placed on top of each photo sensing element. Usually the red, green, and blue (RGB) color filters are arranged in a Bayer pattern, as shown, which alternately samples red, green, and blue pixels.

A required image-processing step for Bayer pattern sensors is interpolation, during which missing data is estimated from neighboring pixel data. Misalignment of the color filter results in color artifacts, and the color filter adds to the cost of the imager. Furthermore, the continuing design pressures to decrease pixel size act to reduce the photodiode sensing area and the signal strength.

One way to prevent the use of color filters and potentially increase the sensing element area is to stack the photo sensing elements (photodiodes). Silicon has characteristic photon absorption lengths that vary with the energy of the photons absorbed. For the wavelengths of 450 nanometers (nm), 550 nm, and 650 nm, the absorption lengths are 0.24 microns (μm), 1.13 μm, and 3.17 μm, respectively. This variation provides an opportunity to fabricate stacked diode junctions at depths that are capable of separating photons of various wavelengths, using standard CMOS manufacturing processes. Various technologies have been applied to this idea over the past 30 years and full color imaging is available in the market place.

In order to provide better resolution, the stacked photodiode set has to be electrically isolated from the adjacent stacked photodiode set. The isolation region is p-type doped region and is connected to the p-region of all pn photodiodes, as well as to ground. There are two ways to fabricate the p-type isolation region. The first is to implant p-type boron into the boundary region between stacked photodiode sets. In order to implant boron into 3 μm deep Si, a high energy implanter and thick photo-resist are needed. Usually, patterned features are relatively large when using thick photoresist and high energy implant. To implant boron into a 3 μm depth, the lateral penetration standard deviation is more than 0.1 μm. Therefore, a wider isolation region is required, which in turn, limits the imager pixel size. For the 130 nm process technology, the optimized pitch for the thick photo resist and high energy implant process is about 8 μm. These processes limit the fabrication of CMOS imagers using a smaller pixel size. For a conventional CMOS imager with a color filter array (CFA) using 130 nm process technology, the pixel size is about 1.75 μm by 1.75 μm.

Another way to isolate the stacked photodiodes is to use an epitaxial process followed by a p-type boron implant into the boundary region between stacked photodiode sets. Since every epitaxial silicon layer is thin (1-2 μm), a lower energy boron implant, thinner photo resist, smaller patterned features, and smaller pixel sizes can be realized. Usually, two to three silicon epitaxial steps are needed to build up enough thickness for stack photodiode fabrication. However, the integrating of two or three epitaxial layers is very complex. In addition, it is well known the interface between epi layer is a relatively large leakage current source, making a low dark current sensor difficult to fabricate.

It would be advantageous if a full color imager could be efficiently fabricated having a low dark current and reduced surface area.

SUMMARY OF THE INVENTION

A dual-pixel full color imager is presented that uses two stand-alone pixels for three color detection. The first pixel is a single photodiode, and the second pixel has two photodiodes built in a stacked structure. For example, the single pixel may be used for green color detection, and the stacked pixel used for blue and red colors detection. The single photodiode pixel uses the state-of-the-art buried photodiode structure in CMOS imager technology. The stacked photodiode pixel can be fabricated simultaneously with the single photodiode structure, and also has a buried photodiode structure. The structures of the two pixels imagers are compatible to standard CMOS processes, so the integration of the two pixels is simple. More importantly, the isolation of the pixel can be achieved by 400 kilo-electron volts (keV) to 600 keV boron ion implantation without using silicon epitaxial processes. The photolithography process for this isolation implant uses a thin photoresist, so fine features can be printed. Therefore, the pixel isolation region is small and process integration is simple.

Accordingly, a dual-pixel full color CMOS imager is provided. The imager comprises a two-photodiode stack including an n doped substrate, a bottom photodiode, and a top photodiode. The bottom photodiode has a bottom p doped layer overlying the substrate and a bottom n doped layer cathode overlying the bottom p doped layer. The top photodiode has a top p doped layer overlying the bottom n doped layer and a top n doped layer cathode overlying the top p doped layer. The single photodiode includes the n doped substrate, a p doped layer overlying the substrate, and an n doped layer cathode overlying the p doped layer.

A first p well overlies exterior edges of the bottom p doped layer, surrounding the top and bottom diodes and connecting the top and bottom p doped layers. An n doped vertical column overlies the bottom p doped layer, extending to a stack top surface, and is adjacent to the first p doped well liner and to the bottom n doped layer. A second p well overlies exterior edges of the single photodiode p doped layer, surrounding the single photodiode. A shallow trench-isolation (STI) layer is interposed between the top n doped layer and the n doped vertical column.

Additional details of the above-described dual-pixel full color imager and an associated fabrication process are provided below.

BRIEF DESCRIPTION OF THE DRAWINGS

FIG. 4 is a partial cross-sectional view of a dual-pixel full color CMOS imager.

DETAILED DESCRIPTION

Figure 1:
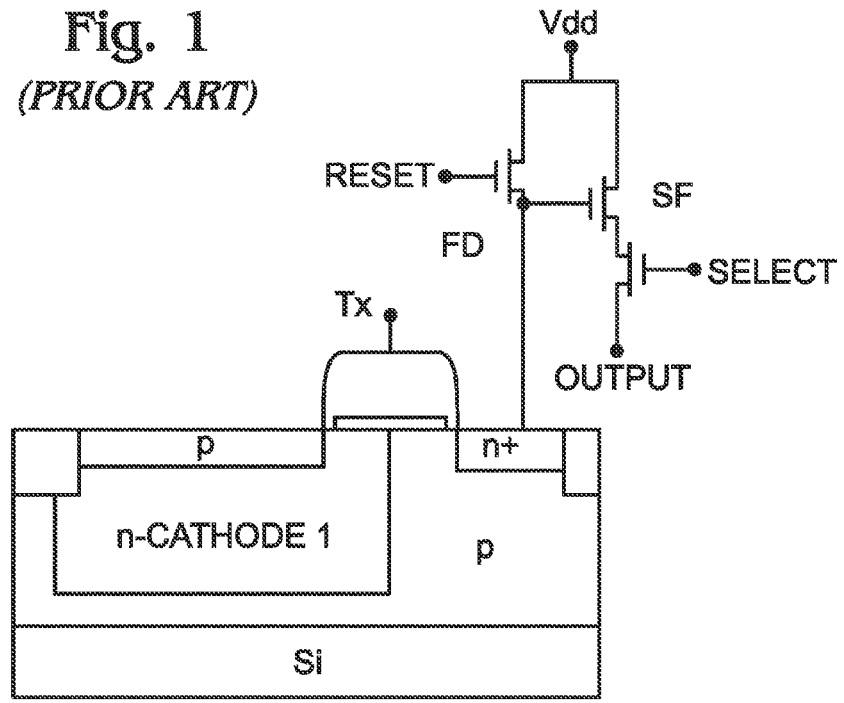
FIG. 1 depicts a complementary metal oxide semiconductor (CMOS) imager with a "buried" or "pinned" photodiode (prior art).
Figure 2:
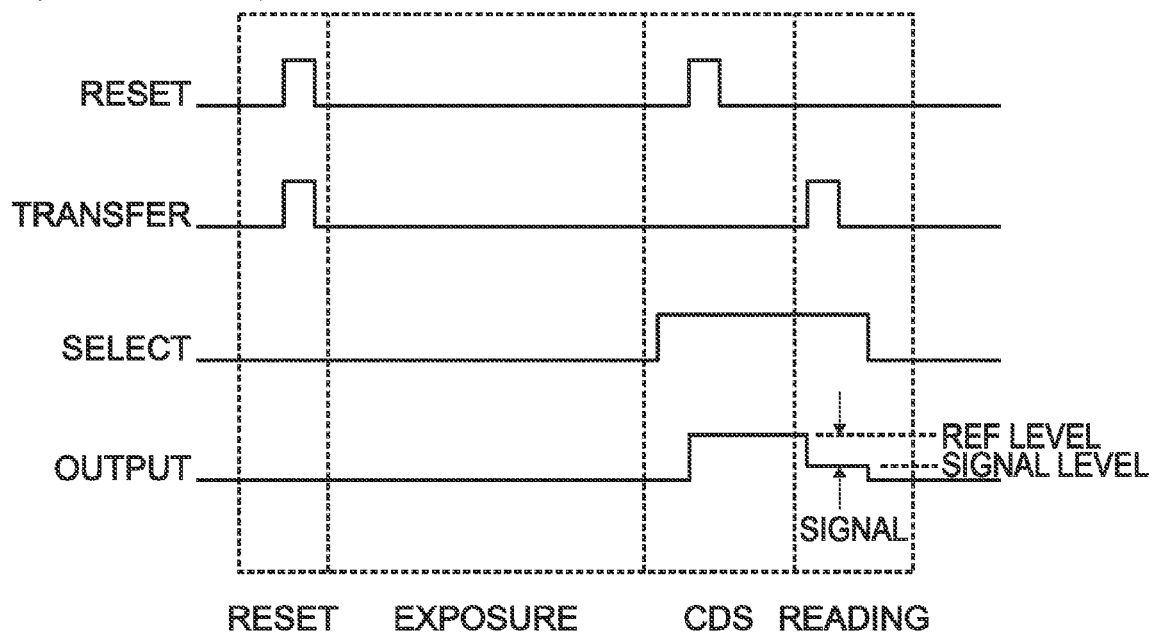
FIG. 2 is a timing diagram associated with of the pixel circuit of FIG. 1 (prior art).

FIG. 4 is a partial cross-sectional view of a dual-pixel full color CMOS imager. The imager 400 comprises a two-photodiode stack 402 including an n doped substrate 404, a bottom photodiode 406, and a top photodiode 408. The bottom photodiode 406 includes a bottom p doped layer 410 overlying the substrate 404 and a bottom n doped layer cathode 412 overlying the bottom p doped layer 410. The top photodiode 408 has a top p doped layer 413 overlying the bottom n doped layer 412 and a top n doped layer cathode 414 overlying the top p doped layer 413. A single photodiode 416 includes the n doped substrate 404, a p doped layer 418 overlying the substrate 404, and an n doped layer cathode 420 overlying the p doped layer 418.

An n doped region, as defined herein, is associated with dopant concentrations in the range of about $1\times10^{15}$ to $5\times10^{17}$ $cm^{-3}$, the n+ doped floating diffusion areas have dopant concentrations in the range of about $1\times10^{19}$ to $1\times10^{21}$ $cm^{-3}$. For the p doped regions, the dopant concentrations are the range of about $5\times10^{15}$ to $5\times10^{17}$ $cm^{-3}$; the p+ surface doped regions have the dopant concentrations in the range of about $5\times10^{17}$ to $1\times10^{19}$ $cm^{-3}$.

A first p well 422 overlies exterior edges of the bottom p doped layer 410, surrounding the top and bottom diodes 406/408 and connecting the top p doped layer 413 with the bottom p doped layer 410. An n doped vertical column 424 overlies the bottom p doped layer 410, extending to a stack top surface 426, and is adjacent to the first p doped well liner 422 and the bottom n doped layer 412. A second p well 430 overlies exterior edges of the single photodiode p doped layer 418, surrounding the single photodiode 416. The first and second p doped wells are connected to ground. A shallow trench-isolation (STI) layer 432a is interposed between the top n doped layer 414 and the n doped vertical column 424. An STI region 432b is interposed between FD 448 and p+ doped layer 456, residing in p doped well 422b/430. Although p doped well regions 422a and 430 have been described as separate regions, they may alternately be considered as a single region with a shared wall.

A first transfer transistor 434 includes a first gate electrode 436 overlying and interposed between the top n doped layer 414 and a first side of the first p well 422a, an n+ doped floating diffusion (FD) first region 438 overlying the first p well 422, and a p+ doped first surface layer 440 overlying the top n doped layer 414. The p doped first surface layer 440 is connected to the first p doped well 422 and ground. The connections to the first p doped well 422 and ground are not shown.

A second transfer transistor 442 includes a second gate electrode 444 overlying and interposed between a second side of the first p well 422b and the n doped vertical column 424. A p+ doped second surface layer 446 overlies the n doped vertical column 424, and is connected to the first p doped well 422 and ground. The connection between the first p doped well 422 and the p+ doped second surface layer 446 cannot be seen in this view. An n+ floating diffusion region second region 448 overlies the first p well 422b and is connected to the floating diffusion first region 438.

A third transfer transistor 450 includes a third gate electrode 452 overlying and interposed between the n doped layer 420 and the second p well 430. An n+ floating diffusion third region 454 overlies the second p well 430 and is connected to the floating diffusion first and second regions 438/448. A p+ doped third surface layer 456 overlies the n doped layer 420, and is connected to the second p well 430 and ground.

Figure 5:
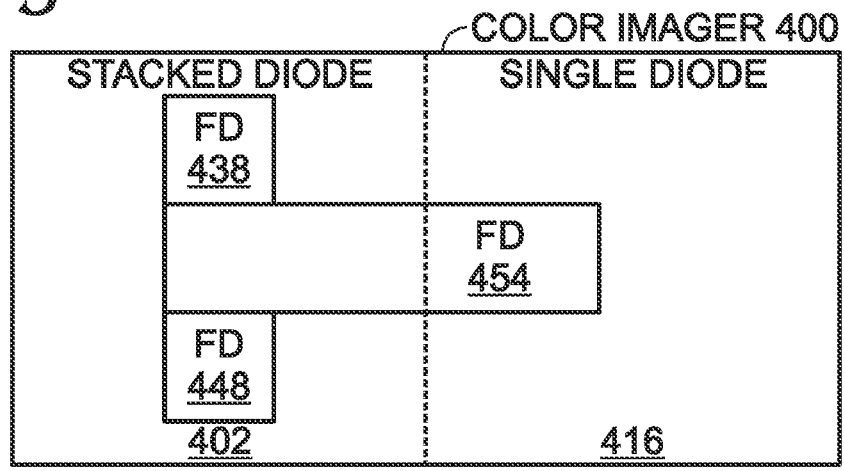
FIG. 5 is a plan view of the color imager of FIG. 4.
Figure 3:
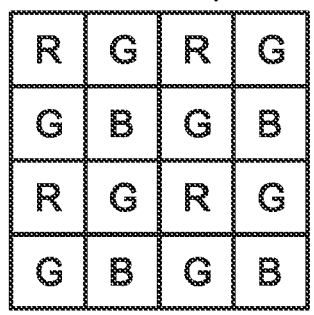
FIG. 3 is a Bayer color filter pattern (prior art).

FIG. 5 is a plan view of the color imager of FIG. 4. Shown are the intersection of FD regions 438, 448, and 454 on the top surface of the color imager 400.

Functional Description

Figure 6:
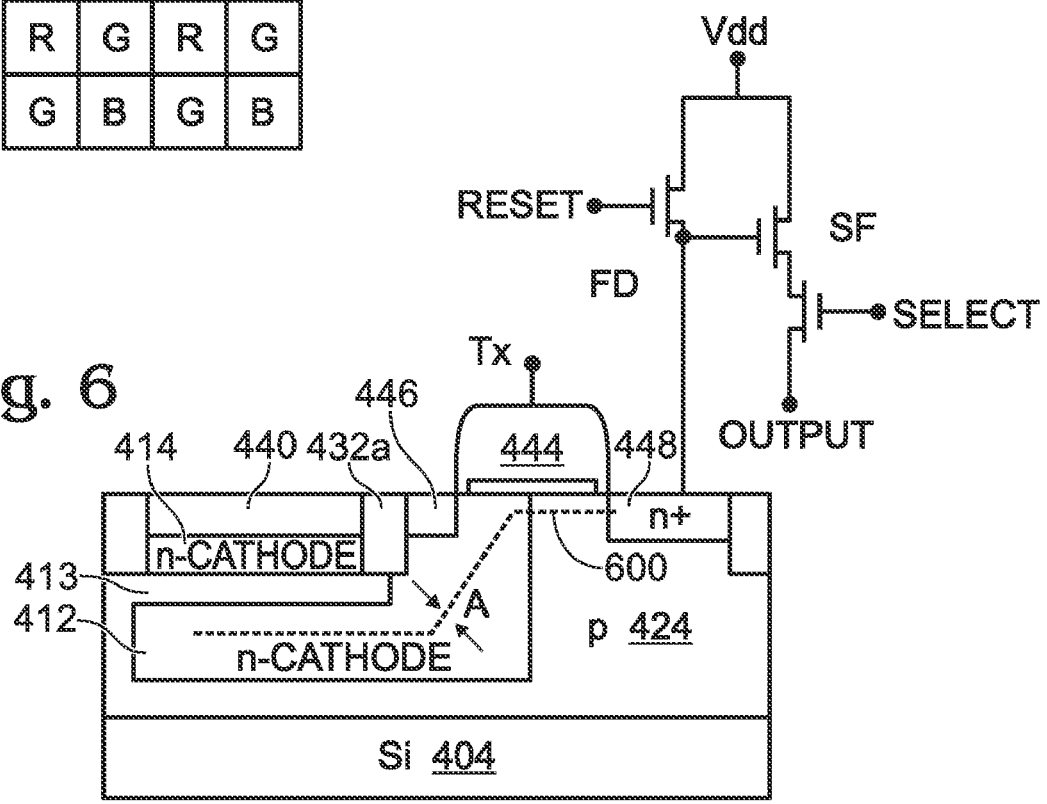
FIG. 6 is a partial cross-section view of the stacked diode of FIG. 4, depicting charge transfer.

FIG. 6 is a partial cross-section view of the stacked diode 402 of FIG. 4, depicting charge transfer. The dual-pixel full color CMOS imager of FIG. 4 has one pixel with a single photodiode (PD) and the other pixel with stacked PDs. One challenge of the design concerns the charge transfer of the bottom PD of the stacked PD pixel. As shown in FIG. 6, the stored charges at the bottom n-cathode 412 have to travel up to the transfer transistor channel 600 before reaching the FD 448. The neck or n doped vertical column 424 (shown by the arrows in region A) is very narrow (the drawing is not to scale), and gets narrower with higher cathode voltages as the transfer process continues. The dotted lines represent charge flow. This narrowing neck causes high resistance and charge transfer issues. The color imager of FIG. 4 addresses the charge transfer issue of the bottom PD of the stacked PD pixel with a minimum of process steps.

Figure 7:
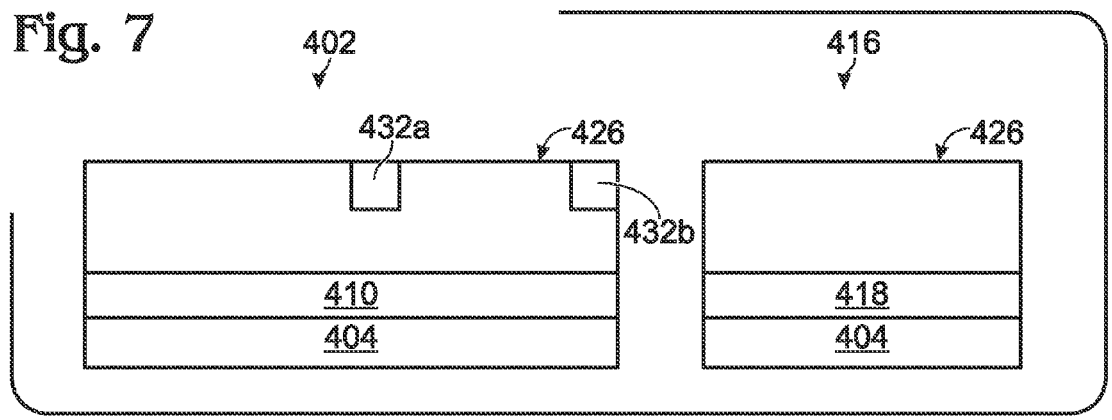
FIGS. 7 through 11 are partial cross-sectional views depicting steps in the fabrication of the completed dual-pixel color imager of FIG. 4.

FIGS. 7 through 11 are partial cross-sectional views depicting steps in the fabrication of the completed dual-pixel color imager of FIG. 4. The process starts with n-type silicon wafers. FIG. 7 depicts the initial implantation of p dopant into an n doped substrate 404. A blanket boron ion implantation with implant energy of 800 keV to 2 MeV, and a dose of around $1e^{12}$ cm$^{-2}$ to $5e^{13}$ cm$^{-2}$ is applied. The implantation may be performed using multiple boron ion implantations. In such a case, a higher dose is used for higher implantation voltages, so that a gradient can be built up, permitting photoelectrons to drift to the lower boron density region.

In one aspect, the boron implantation can be broken into two steps. The first step implants boron only in the stacked diode pixel with a high voltage. The second step implants boron to both pixels with a lower voltage. The implant dose for the first step is higher than the second step. Using this 2-step implantation process, the stacked diode pixel has thicker effective absorption region than the single diode pixel. Since the bottom diode on the stacked diode pixel may be used for red color detection, a deeper absorption region provides better red color absorption. The depth of boron implanted into the silicon is between 1.4 µm to 3 µm. The definition of the depth is the distance from the silicon surface 426 to the position within p doped layer 410 having the peak boron density. The shallow trench isolation (STI) regions 432a and 432b are formed at the stage. The peak boron density within p doped layer 410 defines the absorption depth. (p) doped layers 410 and 418 can be processed in the same step (as shown in FIG. 7), or layer 410 can be made deeper than layer 418, resulting the CMOS imager depicted in FIG. 16.

Figure 8:
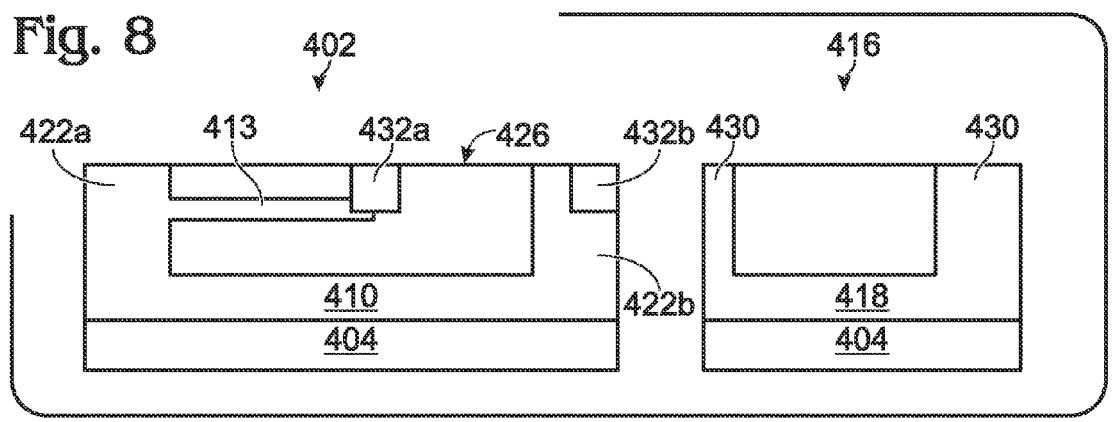

FIG. 8 depicts pixel isolation by boron implantation (p wells 422 and 430). This step involves multiple boron ion implantations with the highest boron implant energy between 400 keV to 600 keV. This implantation enables the p-well connection to the bottom implanted p-type region 410 and forms a full isolation of the photodiodes. The pixel transistors are built on the p-well region. For the stacked diode pixel 402, the isolation between the top and bottom diodes is by boron implantation into top p doped layer 413. The boron implantation energy is between 120 keV to 250 keV and the dose is between $1e^{12}$ to $5e^{13}$ cm$^{-2}$. The depth of top p doped layer 413 (again, the definition of the depth is the distance from the silicon surface 426 to the position inside layer 413 with the peak boron density) is around 0.5 µm to 1.0 µm. This process of implanting layer 413 is an extra process step, as compared to the conventional process steps needed to fabricate the single PD 416.

Figure 9:
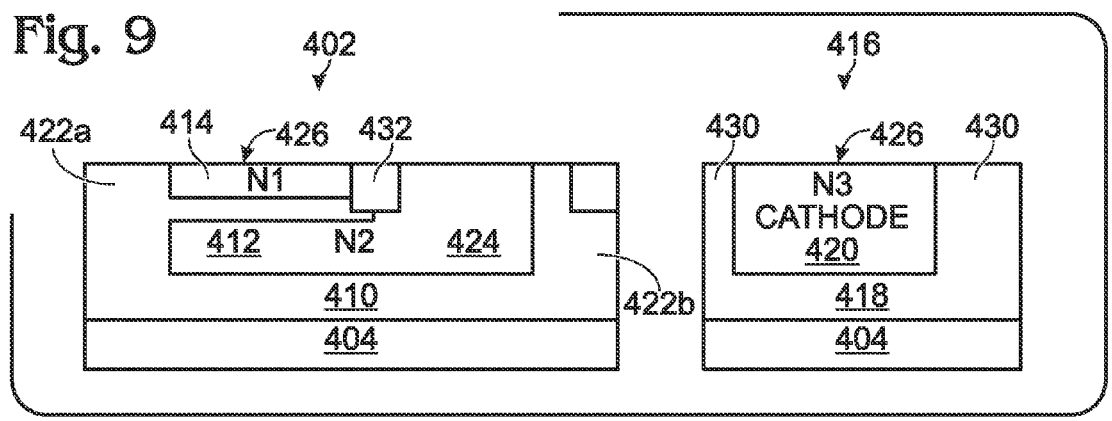

FIG. 9 depicts the implantation of the n doped PD regions. The n-type regions of the photodiodes are implanted with phosphorous or arsenic. The n-doped regions are shown as N2 (412), N1 (414), and N3 (420). The implantation steps for the three regions are separate because the dose and the implant energies are important in determining the depletion voltages of the n-cathodes. For N2, the phosphorous implant energy is between 500 keV to 1.5 MeV with dose between $1e^{12}$ cm$^{-2}$ to $5e^{12}$ cm$^{-2}$. For N1, the n-type implant species can be either phosphorous or arsenic. The implant depth is between 150 nm to 400 nm from the silicon surface 426. The implant dose is between $1e^{12}$ to $5e^{13}$ cm$^{-2}$. For N3, n-type implant species can be either phosphorous, arsenic, or a combination of P and As. The implant depth is between 150 nm to 1000 nm from silicon surface. The total implant dose is between $1e^{12}$ to $5e^{13}$ cm$^{-2}$ and this implant can be multiple implantations. The N3 doping process is conventional in the fabrication of a single PD CMOS imager process, but N1 and N2 are additional process steps.

Figure 10:
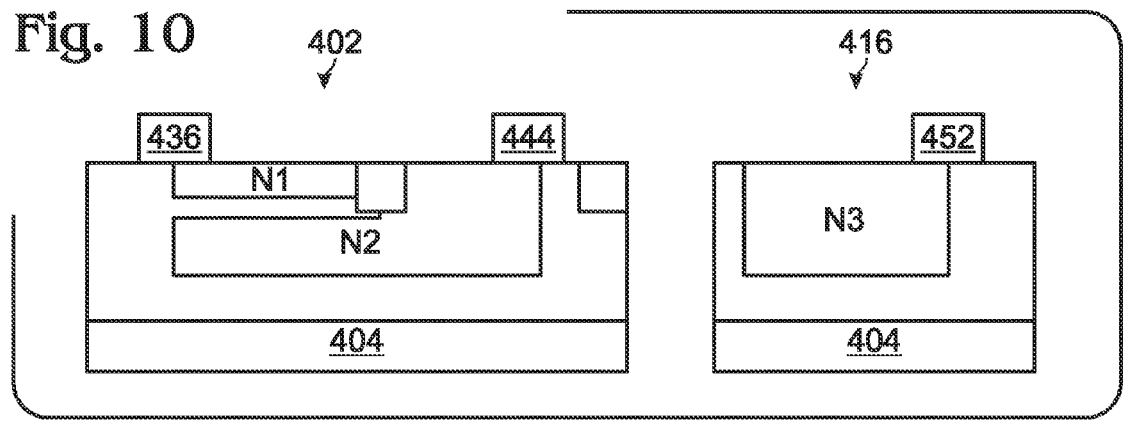

FIG. 10 depicts initial stages in the formation of the transfer transistors. The photodiodes are complete by this step. The transistor fabrication starts with the gate oxide growth (not shown) and poly gate deposition and formation.

Figure 11:
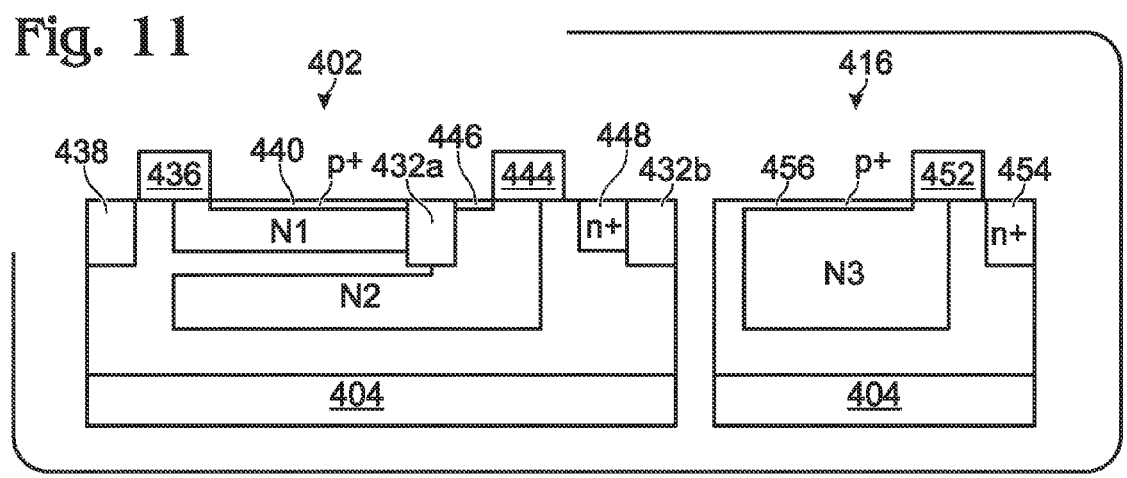

FIG. 11 depicts the n+ and p+ ion implants used for the source/drain (n+ doped FD regions) and the p+ doped surface layers. In this case, the n+ FD region behaves like a drain and the N1/N2/N3 regions act as sources. The poly silicon gates 436/444/452 also receive the n+ ion implantation. The p+ layer passivates the surface states of the p+np photodiode, so the dark current generated by the surface states can be eliminated. The n+ implantation condition is similar to the source/drain implantation condition for the NMOS transistor. That is, phosphorous or arsenic is implanted with a dose of ~$5\times10^{15}$ cm$^{-2}$. The p+ implantation is much less than the S/D implantation of PMOS transistors. That is, boron is implanted with dose of ~$1\times10^{13}$ cm$^{-2}$ and with an energy of 5 keV to 20 keV.

Returning to FIG. 6, a simple way to solve the above-mentioned charge flow problem is to dope restricted area A with a high dose of n-type dopant. This doping reduces the resistance of region A, so a complete charge transfer process can be realized. However, this process also causes two problems. First, an additional photo process is needed for this ion implantation, and secondly, this region cannot be depleted with a low voltage as desired in the reset step. A non-fully depleted photodiode results in the reset noise and image lag.

Figure 12:
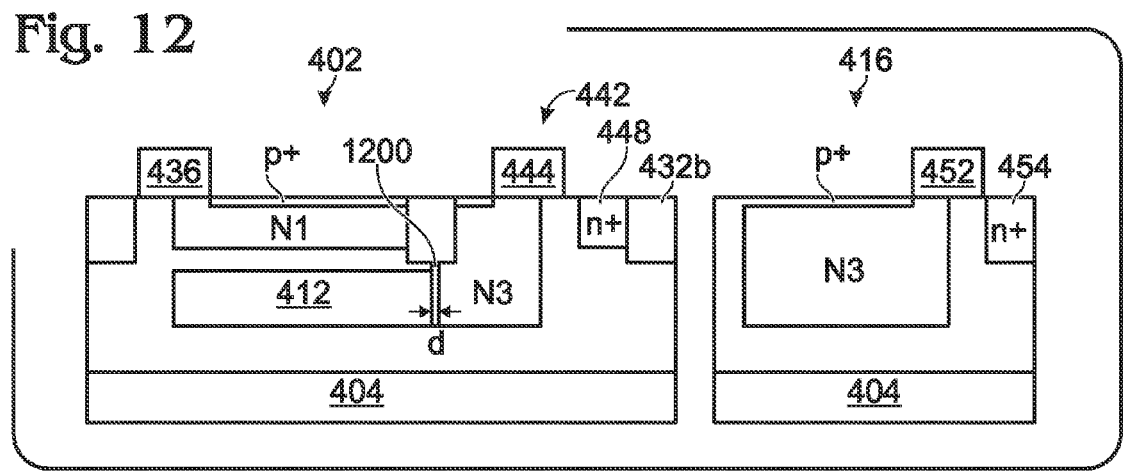
FIG. 12 is a partial cross-sectional view considering the issue of charge transfer in the color imager of FIG. 4.

FIG. 12 is a partial cross-sectional view considering the issue of charge transfer in the color imager of FIG. 4. The signal electrons of the single diode pixel 416 are completely transferred from the buried PD to the FD 454 by using a low depletion voltage. For example, the depletion voltage, or the pinned voltage $V_{pin-3}$=1.5V, which is less than the operation voltage of 2.5V. Considering the charge transfer issue of the bottom PD in the stacked PDs 402, the N2 implantation only dopes the buried cathode under top p doped layer 413. The N3 implantation is used to connect the buried cathode to the transfer transistor 442. In order to completely transfer the signal electrons from the buried PD (N2) to the FD 448, the depletion voltage, $V_{pin-2}$, at the N2 cathode region is designed to be lower than $V_{pin-3}$. For example, the depletion voltage $V_{pin-2}$=1.3V, which is less than the depletion voltage $V_{pin-3}$=1.5V at operation voltage of 2.5V. In this case, the charge at the N2 area is depleted prior to the pinch off at the N3 area. An important parameter in complete charge transfer and full depletion is the overlap (d) 1200 between the N2 implant and the N3 implant. The overlap is between 0 and 0.3 um.

Thus, the N3 implant is used to connect the bottom PD cathode 412 to the transfer transistor 442. $V_{pin-2}<V_{pin-3}$, the voltage difference is between 0 to 0.5V. Further, the overlap between the N3 implant and the N2 implant in the bottom PD is between 0 to 0.3 um.

Figure 13:
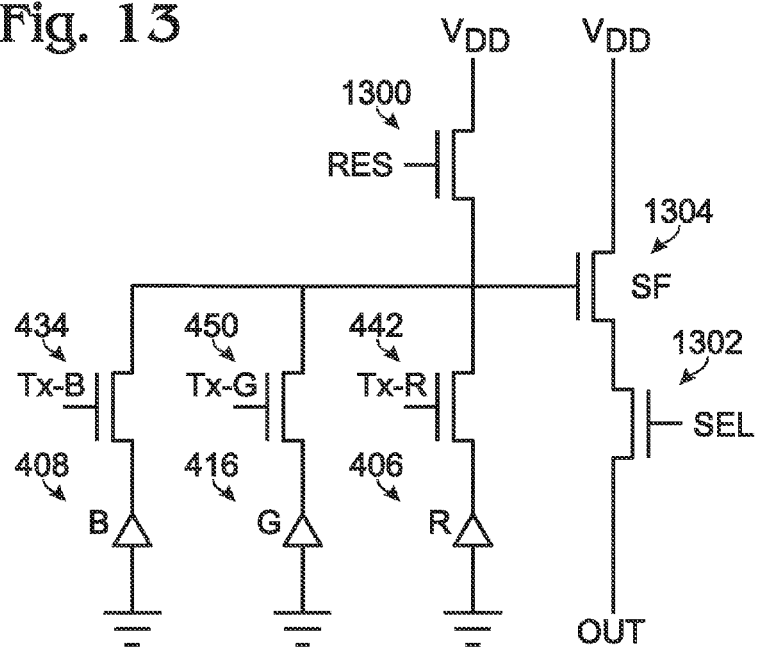
FIG. 13 is a schematic diagram depicting an active pixel sensor (APS) cell circuit, such as might be used to interface with the transfer transistors of FIG. 4.

FIG. 13 is a schematic diagram depicting an active pixel sensor (APS) cell circuit, such as might be used to interface with the transfer transistors of FIG. 4. As described before, the transfer transistors are 434 (Tx-B), 450 (Tx-G), and 442 (Tx-R). For this example, the photodiodes are 406 (R), 416

(G), and 408 (B). The reset (Res) 1300, select (Sel) 1302, and source follower (SF) 1304 transistors may be fabricated on the p-wells.

Figure 14:
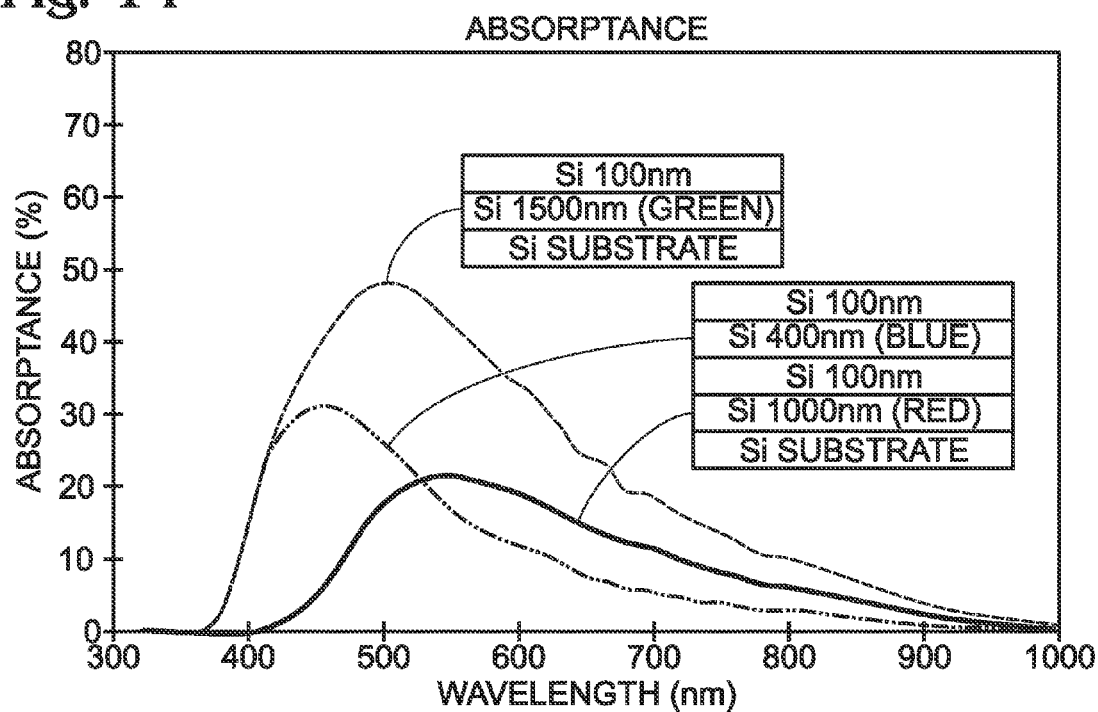
FIG. 14 is an optical simulation of the Si absorption spectra.

FIG. 14 is an optical simulation of the Si absorption spectra. It is assumed that the blue diode collects the photoelectrons generated between 100 nm to 500 nm; the green diode collects the photoelectrons generated between 100 nm to 1600 nm; and the red diode collects the photoelectrons generated between 600 nm to 1600 nm. In order to have better RGB spectra separation, color filters may be employed. If the bottom PD of the PD stack is red, a deeper boron implant in the stacked photodiode pixel (region 410 of FIG. 7) can push the red diode absorption spectrum to a longer wavelength.

Figure 15:
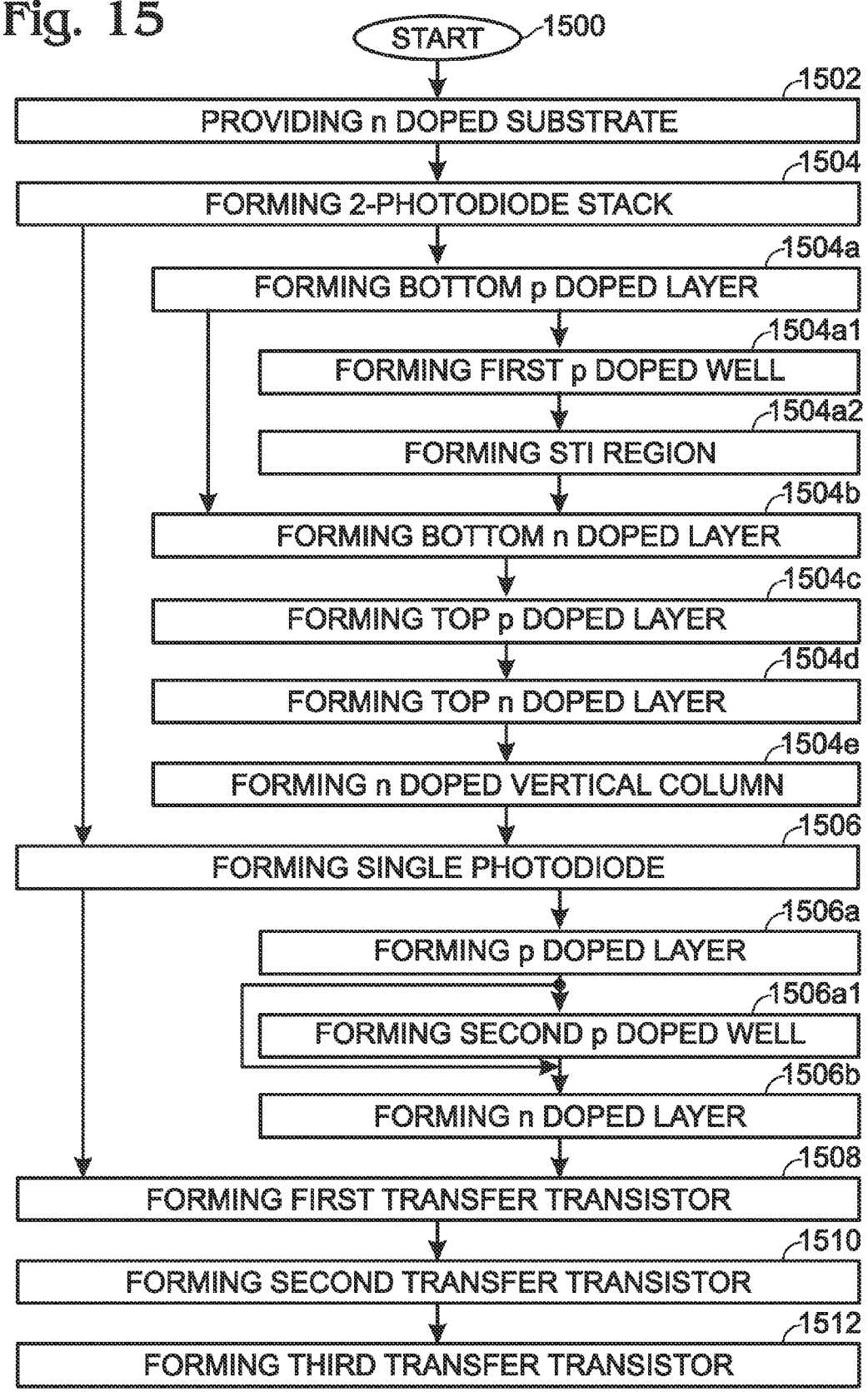
FIG. 15 is a flowchart illustrating a method for forming a dual-pixel full color CMOS imager.

FIG. 15 is a flowchart illustrating a method for forming a dual-pixel full color CMOS imager. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1500.

Step 1502 provides an n doped substrate. Step 1504 forms a two-photodiode stack, including a bottom photodiode with a bottom p doped layer overlying the substrate (Step 1504a) and a bottom n doped layer cathode overlying the bottom p doped layer (Step 1504b). Step 1504 also forms a top photodiode having a top p doped layer overlying the bottom n doped layer (Step 1504c) and a top n doped layer cathode overlying the top p doped layer (Step 1504d). Step 1506 forms a single photodiode including a p doped layer overlying the substrate (Step 1506a) and an n doped layer cathode overlying the p doped layer (Step 1506b).

In one aspect, forming the bottom p doped layer (Step 1504a) and the single photodiode p doped layer (Step 1506a) includes implanting boron to form the bottom p doped layer in a first region of the substrate and the single photodiode p doped layer in a second region of the substrate. Step 1504a1 forms a first p well overlying exterior edges of the bottom p doped layer, surrounding the top and bottom photodiodes and connected to ground. Step 1506a1 forms a second p well overlying exterior edges of the single photodiode p doped layer, surrounding the single photodiode and connected to ground. Then, forming the top p doped layer in Step 1504c includes forming the top p doped layer in the first region of the substrate overlying the bottom p doped layer, leaving an intervening n doped layer. Step 1504e forms an n doped vertical column adjacent the first p well, extending from the bottom p doped layer to a stack top surface.

Forming the bottom n doped layer in Step 1504b includes implanting phosphorus into the n layer intervening between the top and bottom p doped layers. In one aspect, Step 1504a2 forms a shallow trench isolation (STI) region. Then, forming the top n doped layer (Step 1504d) includes implanting phosphorus (P), arsenic (As), or a combination of P and As, into an n layer overlying the top p doped layer.

Forming the single photodiode n doped layer in Step 1506b includes implanting P, As, or a combination of P and As, into the single photodiode n layer overlying the single photodiode p doped layer. In one aspect, the n doped vertical column of Step 1504e is formed by implanting n dopant into the n doped vertical column simultaneously with implanting the bottom n doped layer (Step 1504b), and implanting n dopant into the n doped vertical column simultaneously with implanting the top n doped layer (Step 1504d). That is, Step 1504e is performed as a part of Steps 1504b and 1504d. In another aspect, forming the n doped vertical column in Step 1504e includes simultaneously implanting an n dopant into the single photodiode n layer (Step 1506b) and the n doped vertical column. That is, Step 1504e is performed at the same time as Step 1506b.

In one aspect, implanting boron to form the bottom p doped layer in a first region of the substrate (Step 1504a) and the single photodiode p doped layer in a second region of the substrate (Step 1506a) includes multiple blanket implantations, where higher boron doses are used with higher implantation voltages, to form a dosage gradient in the bottom and single photodiode p doped layers. Alternately, implanting boron to form the bottom p doped layer in a first region of the substrate (Step 1504a) and the single photodiode p doped layer in a second region of the substrate (Step 1506a) includes: a first implantation into the bottom p doped layer at a first voltage level and a first dosage; and, a second implantation into the bottom and single photodiode p doped layers with a second voltage level, less that the first voltage level, and a second dosage, less than the first dosage.

Step 1508 forms a first transfer transistor overlying the two-photodiode stack connected to the top photodiode. Step 1510 forms a second transfer transistor overlying the two-photodiode stack connected to the bottom photodiode. Step 1512 forms a third transfer transistor overlying the single photodiode. In one aspect, Step 1508 includes implanting boron, forming a p doped first surface layer overlying the top n doped layer and connected to the first p doped well and ground. Step 1510 implants boron, forming a p doped second surface layer overlying the n doped column and connected to the first p doped well and ground. Step 1512 implants boron, forming a p doped third surface layer overlying the single photodiode n doped layer and connected to the second p doped well and ground.

Steps 1508, 1510, and 1512 also implant As, P, or a combination of As and P, forming an n+ doped floating diffusion first region overlying the first p well (422a, see FIG. 4)), an n+ floating diffusion second region overlying the first p well (422b), and an n+ floating diffusion third region overlying the second p well (430). The floating diffusion first, second, and third regions are connected together.

Step 1508 forms a first gate electrode overlying and interposed between the floating diffusion first region and the first p doped surface layer. Step 1510 forms a second gate electrode overlying and interposed between the floating diffusion second region and the p doped second surface layer. Step 1512 forms a third gate electrode overlying and interposed between the floating diffusion third region and the p doped third surface layer.

Figure 16:
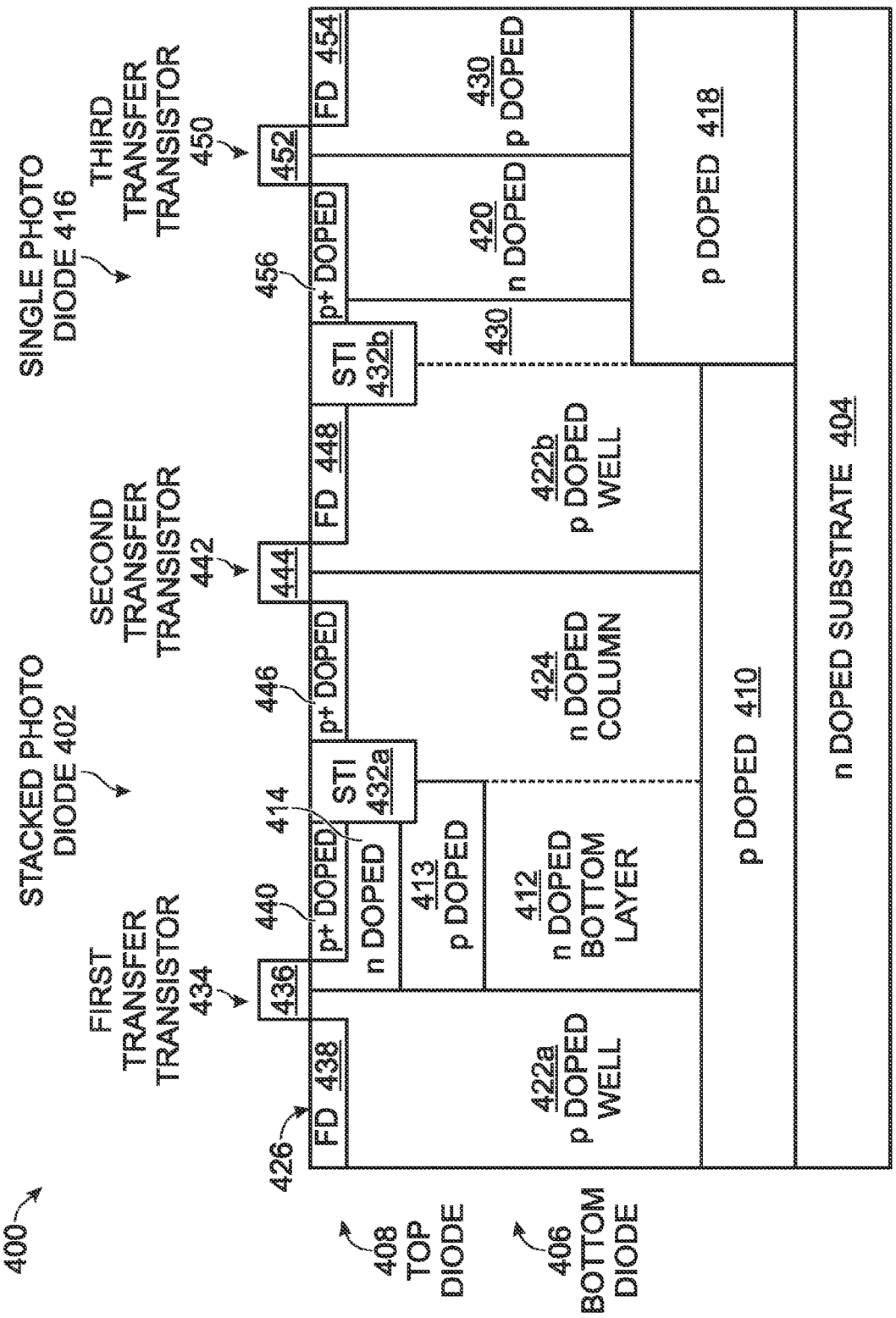
FIG. 16 is a partial cross-sectional view of the dual pixel full Color CMOS imager of FIG. 4, where the single pixel of p doped layer depth is shallower than the bottom p doped layer of the two-photodiode stack.

FIG. 16 is a partial cross-sectional view of the dual pixel full color CMOS imager of FIG. 4, where the single pixel p doped layer depth is shallower than the bottom p doped layer of the two-photodiode stack.

A dual-pixel full color CMOS imager has been presented. Examples of explicit structural details and process steps have been provided to illustrate the invention. However, the invention is not limited to just these examples. Other variations and embodiments of the invention will occur to those skilled in the art.

We claim:
1. A dual-pixel full color complementary metal oxide semiconductor (CMOS) imager comprising:
  a two-photodiode stack including:
    an n doped substrate;
    a bottom photodiode with a bottom p doped layer overlying the substrate at a first depth and connected to a ground, and a bottom n doped layer cathode overlying the bottom p doped layer;

a top photodiode having top p doped layer connected to the ground, directly overlying the bottom n doped layer without an intervening layer, at a second depth, and a top n doped layer cathode overlying the top p doped layer;
a single photodiode including:
the n doped substrate;
a p doped layer overlying the substrate at a third depth and an n doped layer cathode overlying the p doped layer, where the third depth is less than, or equal to the first depth;
a first p well overlying exterior edges of the bottom p doped layer, surrounding the top and bottom diodes and connected to the top p doped layer; and,
an n doped vertical column overlying the bottom p doped layer, extending to a stack top surface, and adjacent a first p well liner and the bottom n doped layer;
a second p well overlying exterior edges of the single photodiode p doped layer, surrounding the single photodiode.

2. The photodiode array of claim 1 further comprising:
a shallow trench-isolation (STI) layer interposed between the top n doped layer and the n doped vertical column.

3. The photodiode array of claim 2 further comprising:
a first transfer transistor including:
    a first gate electrode overlying and interposed between the top n doped layer and the first p well;
    an n+ doped floating diffusion first region overlying the first p well;
    a p+ doped first surface layer overlying the top n doped layer and connected to the first p doped well;
a second transfer transistor including:
    a second gate electrode overlying and interposed between the first p well and the n doped vertical column;
    a p+ doped second surface layer overlying the n doped vertical column and connected to the first p doped well;
    an n+ floating diffusion region second region overlying the first p well and connected to the floating diffusion first region;
a third transfer transistor including:
    a third gate electrode overlying and interposed between the single photodiode n doped layer and the second p doped well;
    an n+ floating diffusion third region overlying the second p well and connected to the floating diffusion first and second regions; and,
    a p+ doped third surface layer overlying the single photodiode n doped layer, and connected to the second p doped well and ground.

4. A method for forming a dual-pixel full color complementary metal oxide semiconductor (CMOS) imager, the method comprising:
providing an n doped substrate;
forming a two-photodiode stack including:
    a bottom photodiode with a bottom p doped layer overlying the substrate at a first depth and a bottom n doped layer cathode overlying the bottom p doped layer; and,
    a top photodiode having a top p doped layer overlying the bottom n doped layer without an intervening layer, at a second depth, and a top n doped layer cathode overlying the top p doped layer;
forming a single photodiode including a p doped layer overlying the substrate at a third depth and an n doped layer cathode overlying the p doped layer, where the third depth is equal to the first depth;
wherein forming the bottom p doped layer and single photodiode p doped layer includes simultaneously in concurrent processes, implanting boron to form the bottom p doped layer in a first region of the substrate and the single photodiode p doped layer in a second region of the substrate; and
the method further comprising:
forming a first p well overlying exterior edges of the bottom p doped layer, surrounding the top and bottom photodiodes and connected to ground;
forming a second p well overlying exterior edges of the single photodiode p doped layer, surrounding the single photodiode and connected to ground;
forming an n doped vertical column adjacent the first p well, extending from the bottom p doped layer to a stack top surface; and,
wherein forming the top p doped layer includes forming the top p doped layer in the first region of the substrate overlying the bottom p doped layer, leaving an intervening n doped layer.

5. The method of claim 4 wherein forming the bottom n doped layer includes implanting phosphorus into the n layer intervening between the top and bottom p doped layers.

6. The method of claim 5 further comprising:
forming a shallow trench isolation (STI) region; and,
wherein forming the top n doped layer includes implanting a dopant selected from a group comprising phosphorus (P), arsenic (As), and a combination of P and As, into an n layer overlying the top p doped layer.

7. The method of claim 6 wherein forming the single photodiode n doped layer includes implanting a dopant selected from a group consisting of P, As, and a combination of P and As, into the single photodiode n layer overlying the single photodiode p doped layer.

8. The method of claim 7 wherein forming the n doped vertical column includes implanting n dopant into the n doped vertical column simultaneously with implanting the bottom n doped layer, and implanting n dopant into the n doped vertical column simultaneously with implanting the top n doped layer.

9. The method of claim 7 wherein forming the n doped vertical column includes simultaneously implanting an n dopant into the single photodiode n layer and the n doped vertical column.

10. The method of claim 4 wherein simultaneously implanting boron to form the bottom p doped layer in a first region of the substrate and the single photodiode p doped layer in a second region of the substrate includes multiple blanket implantations, where higher boron doses are used with higher implantation voltages, to form a dosage gradient in the bottom and single photodiode p doped layers.

11. The method of claim 4 wherein forming the bottom p doped layer and single photodiode p doped layer includes:
a first implantation into the bottom p doped layer at a first voltage level and a first dosage;
a second implantation into the bottom and single photodiode p doped layers with a second voltage level, less that the first voltage level, and a second dosage, less than the first dosage; and,
forming the first depth greater than the third depth.

12. The method of claim 4 further comprising:
forming a first transfer transistor overlying the two-photodiode stack connected to the top photodiode;
forming a second transfer transistor overlying the two-photodiode stack connected to the bottom photodiode; and, forming a third transfer transistor overlying the single photodiode.

13. The method of claim 12 wherein forming the first, second, and third transfer transistors includes implanting boron, forming a p doped first surface layer overlying the top n doped layer and connected to the first p well and ground, forming a p doped second surface layer overlying the n doped vertical column and connected to the first p well and ground, and forming a p doped third surface layer overlying the single photodiode n doped layer and connected to ground.

14. The method of claim 13 wherein forming the first, second, and third transfer transistors includes implanting a dopant selected from a group consisting of As, P, and a combination of As and P, forming an n+ doped floating diffusion first region overlying the first p well, an n+ floating diffusion second region overlying the first p well, and an n+ floating diffusion third region overlying the second p well, wherein the floating diffusion first, second, and third regions are connected together.

15. The method of claim 14 forming the first, second, and third transfer transistors includes:
    forming a first gate electrode overlying and interposed between the floating diffusion first region and the first p doped surface layer;
    forming a second gate electrode overlying and interposed between the floating diffusion second region and the p doped second surface layer; and,
    forming a third gate electrode overlying and interposed between the floating diffusion third region and the p doped third surface layer.

16. The photodiode array of claim 1 wherein the bottom photodiode p doped layer first depth is in a range of 1400 to 3000 nanometers (nm);
    wherein the top photodiode p doped layer second depth is in a range of 500 to 1000 nm; and,
    wherein the single photodiode p doped third depth is in a range of 1400 to 3000 nm.

17. The photodiode array of claim 1 wherein the bottom photodiode collects photoelectrons generated in silicon in a range between the first depth and the second depth;
    wherein the top photodiode collects photoelectrons generated in silicon in a range between a surface of the two-diode stack and the second depth; and,
    wherein the single photodiode collects photoelectrons generated in silicon in a range between a surface of the single diode and the third depth.

18. The method of claim 4 wherein forming the bottom photodiode p doped layer at the first depth includes forming the first depth in a range of 1400 to 3000 nanometers (nm);
    wherein forming the top photodiode p doped layer second depth includes forming the second depth in a range of 500 to 1000 nm; and,
    wherein forming the single photodiode p doped third depth includes forming the third depth is in a range of 1400 to 3000 nm.

19. The method of claim 11 wherein forming the first depth greater than the third depth includes forming the first depth in a range between 1400 and 3000 nm, and the third depth less than the first depth.

* * * * *